(12) United States Patent
Wei et al.

(10) Patent No.: US 9,841,301 B2
(45) Date of Patent: Dec. 12, 2017

(54) DIGITALLY CONTROLLED CHIRPED PULSE LASER FOR SUB-TERAHERTZ RANGE FIBER STRUCTURE INTERROGATION

(71) Applicant: Rhode Island Board of Education, State of Rhode Island and Providence Plantations, Providence, RI (US)

(72) Inventors: Tao Wei, West Kingston, RI (US); Zhen Chen, Kingstown, RI (US); Gerald Hefferman, Warwick, RI (US)

(73) Assignee: RHODE ISLAND BOARD OF EDUCATION, STATE OF RHODE ISLAND AND PROVIDENCE PLANTATIONS, Providence, RI (US)

( * ) Notice: Subject to any disclaimer, the term of this patent is extended or adjusted under 35 U.S.C. 154(b) by 0 days.

(21) Appl. No.: 15/417,455

(22) Filed: Jan. 27, 2017

(65) Prior Publication Data

US 2017/0153130 A1 Jun. 1, 2017

Related U.S. Application Data

(63) Continuation-in-part of application No. 14/955,132, filed on Dec. 1, 2015.

(51) Int. Cl.
*G01B 11/16* (2006.01)
*G01D 5/353* (2006.01)

(52) U.S. Cl.
CPC ..... *G01D 5/35335* (2013.01); *G01D 5/35329* (2013.01)

(58) Field of Classification Search
CPC .......................... G01B 11/16; G01D 5/35335
USPC ......................................................... 356/35
See application file for complete search history.

(56) References Cited

U.S. PATENT DOCUMENTS

2017/0108358 A1* 4/2017 Bastianini .......... G01D 5/35335

* cited by examiner

*Primary Examiner* — Roy M Punnoose
(74) *Attorney, Agent, or Firm* — Barlow, Josephs & Holmes, Ltd.

(57) ABSTRACT

The present disclosure provides a sweep velocity-locked laser pulse generator (SV-LLPG) controlled using a digital phase locked loop (DPLL) circuit. The SV-LLPG is utilized for the interrogation of sub-terahertz-range fiber structures for sensing applications that require real-time data collection with mm-level spatial resolution. A laser generates chirped laser pulses via injection current modulation and a DPLL circuit locks the optical frequency sweep velocity. A high-quality linearly chirped laser pulse with a frequency excursion of 117.69 GHz at optical communication bands using a distributed feedback laser is provided.

14 Claims, 8 Drawing Sheets

DIGITALLY CONTROLLED CHIRPED PULSE LASER FOR SUB-TERAHERTZ RANGE FIBER STRUCTURE INTERROGATION

CROSS-REFERENCE TO RELATED APPLICATIONS

This application is a Continuation-in-Part of co-pending U.S. application Ser. No. 14/855,132, filed Dec. 1, 2015, the entire content of which, is incorporated herein by reference.

STATEMENT OF GOVERNMENT INTEREST

The present invention was made with government support under Grant Nos. CCF1439011, CMMI1462656 and EAR1442623, all awarded by the National Science Foundation. The government has certain rights in the invention.

BACKGROUND OF THE INVENTION (1) Field of the Invention

The instant invention relates to fiber optic devices for distributed sensing applications, and more particularly to a sweep velocity-locked laser pulse generator (SV-LLPG) controlled using a digital phase locked loop (DPLL) circuit for the interrogation of sub-terahertz-range fiber structures and intrinsic Rayleigh backscatter along the length of an optical fiber.

(2) Description of Related Art

Sub-terahertz-range fiber structures (sub-THz-FS) have demonstrated their feasibility for distributed strain and temperature sensing applications. By definition, a sub-THz-FS is an optical fiber inline structure with characteristic geometries in the millimeter or sub-millimeter range that can be interrogated using sub-THz bandwidths in the optical frequency band. Uniquely, sub-THz-FSs allow systems to simultaneously achieve distributed strain and temperature measurements with high-accuracy and high spatial resolution using a narrow interrogation bandwidth. Previously, the interrogation system of sub-THz-FSs has been based on coherent optical frequency domain reflectometry (C-OFDR) techniques where the key component was a highly coherent swept laser source. More specifically, the laser source comprised an external cavity tunable laser (ECL). An ECL tunes its lasing wavelength via modulating the physical length of an externally-coupled cavity. Recent progress in micro-electro-mechanical systems (MEMS) technologies has led to miniaturized ECLs that can be as compact as conventional semiconductors. The unique advantage of ECLs include high coherence length and mode-hop-free broadband tuning (>100 nm or >12.5 THz at the 1.55 μm band). However, their disadvantages include inconsistent sweep velocity, non-repeatable starting wavelength, high system complexity with geometrically coupled moving optical components, and high cost. Several additional components are needed to compensate for these limitations. For example, an auxiliary sampling clock (k-clock) is employed to accommodate nonlinear sweep speeds and a wavelength reference gas cell is used to calibrate starting wavelength. Although effective, these methods add complexity, cost, and increased device footprint to ECLs.

SUMMARY OF THE INVENTION

The present disclosure provides a novel chirped pulse laser source based on a semiconductor laser, which is capable of mode-hop-free wavelength tuning by modulating its injection current without the need for moving geometric-optic components.

There are two critical fundamental challenges associated with using a frequency sweep technique for C-OFDR-based applications: (1) a limited tuning bandwidth (~100 GHz), and (2) a nonlinear relationship between injection current and laser frequency, leading to inconsistent sweep velocities. The challenge of limited bandwidth, which restricts the spatial resolution of many C-OFDR applications, is overcome using sub-THz-FSs due to their unique, proven ability to facilitate narrow interrogation bandwidth operation. Thus, inconsistent sweep velocity represents the key remaining challenge precluding the use of tunable semiconductor lasers for sub-THz-FS sensor interrogation. Efforts have been made to overcome this remaining limitation by implementing an auxiliary sampling clock; however, due to the Nyquist criterion, the delay line for the interferometer used in the sampling clock must be at least four times longer than the total length of sensing arm. This long delay line makes the interrogation system more susceptible to ambient noise, and, given the same sweep velocity, necessitates the use of high frequency electronics, resulting in increased design complexity and system cost.

The present disclosure describes an alternative approach that actively linearizes the frequency sweep in order to overcome the remaining challenge of inconsistent sweep velocity directly, allowing for purely-electronically modulated lasers to be used for sub-THz-FS sensor interrogation. More specifically, the disclosure provides a sweep velocity-locked laser pulse generator (SV-LLPG) based on a digital phase locked loop (DPLL) design. Using this approach, a tuning bandwidth of 117.69 GHz was achieved over 8.3 ms using a distributed feedback (DFB) laser. A highly consistent sweep velocity of 14.2 GHz was maintained within each chirped pulse. The standard deviation of the starting frequency was measured to be 109 MHz, corresponding to a strain sensing instability of 0.75με, or a temperature sensing instability of 0.08° C., obviating the necessity of starting frequency calibration of any kind for most applications. In an exemplary sensing system, the SV-LLPG was used to interrogate a sub-THz-FS.

In an exemplary embodiment of a linear strain measurement device, a linear strain response was obtained with a sensitivity of −0.1436 GHz/με, which agrees with previously reported results obtained using an ECL.

Additionally, in an exemplary embodiment of a temperature measurement device, a soldering iron was employed as a heat source to form a temperature distribution along a continuously cascaded sub-THz-FS array to demonstrate its high spatial resolution distributed sensing capability.

BRIEF DESCRIPTION OF THE DRAWING FIGURES

While the specification concludes with claims particularly pointing out and distinctly claiming particular embodiments of the instant invention, various embodiments of the invention can be more readily understood and appreciated from the following descriptions of various embodiments of the invention when read in conjunction with the accompanying drawings in which:

Figure 2A:
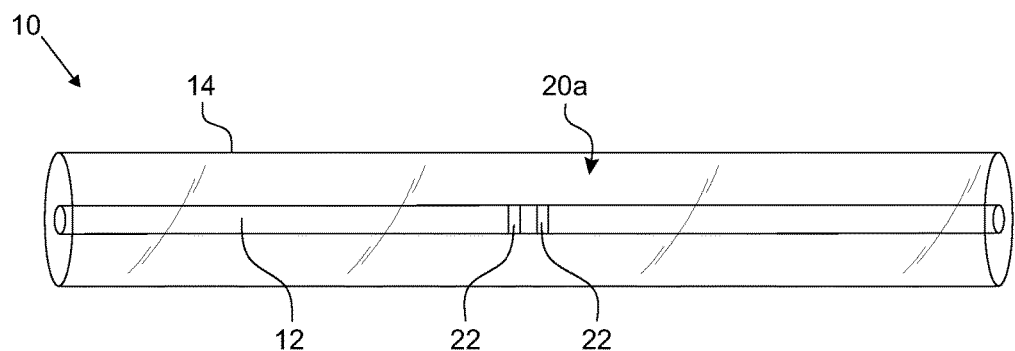
FIG. 2a is a side elevation view of the core and cladding of an optical fiber including a single sub-terahertz-range reflector cavity.
Figure 2B:
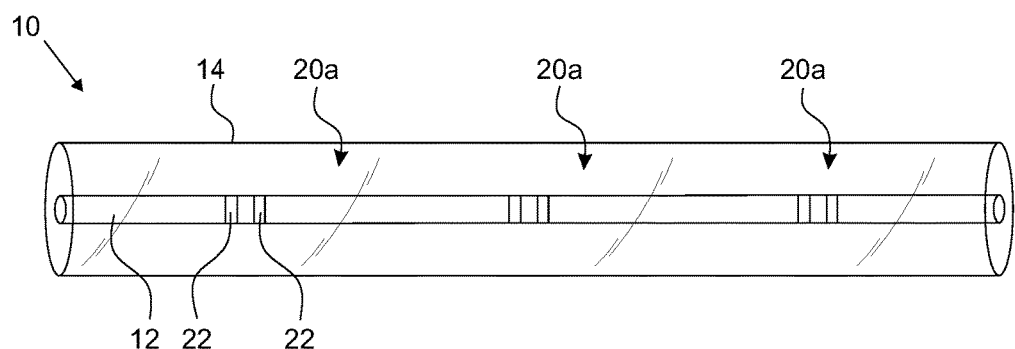
Figure 2C:
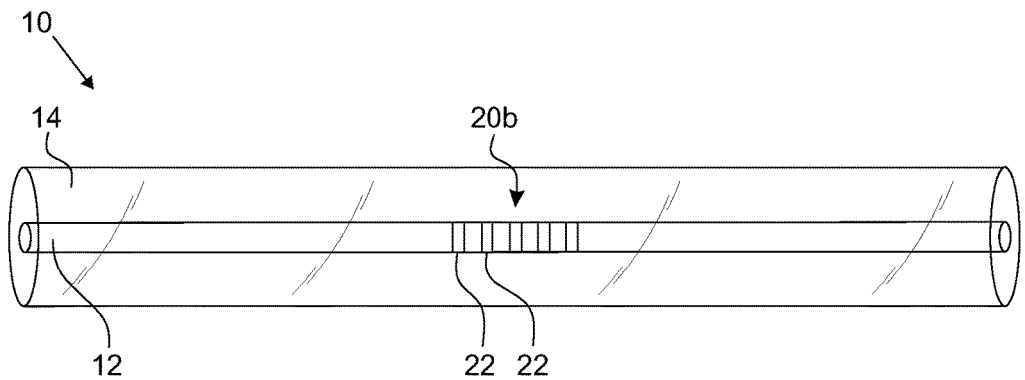
Figure 2D:
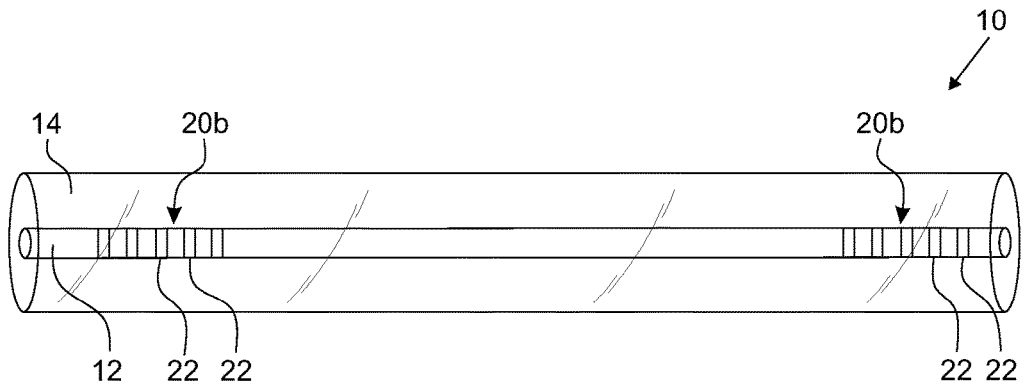
Figure 2E:
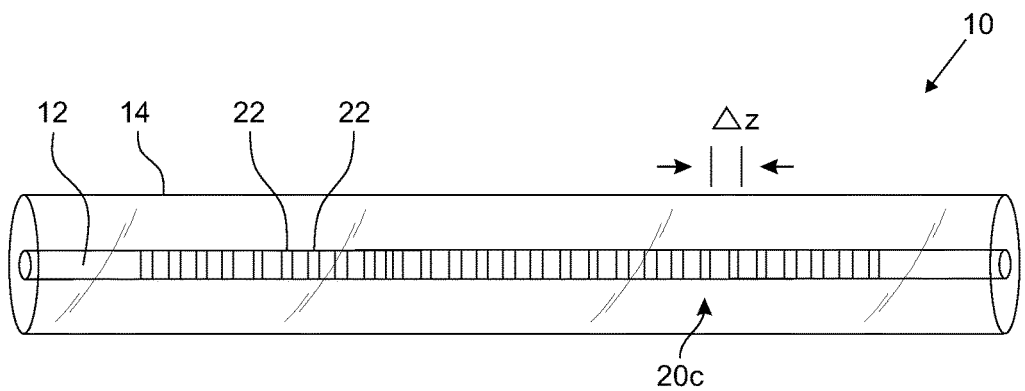
Figure 3:
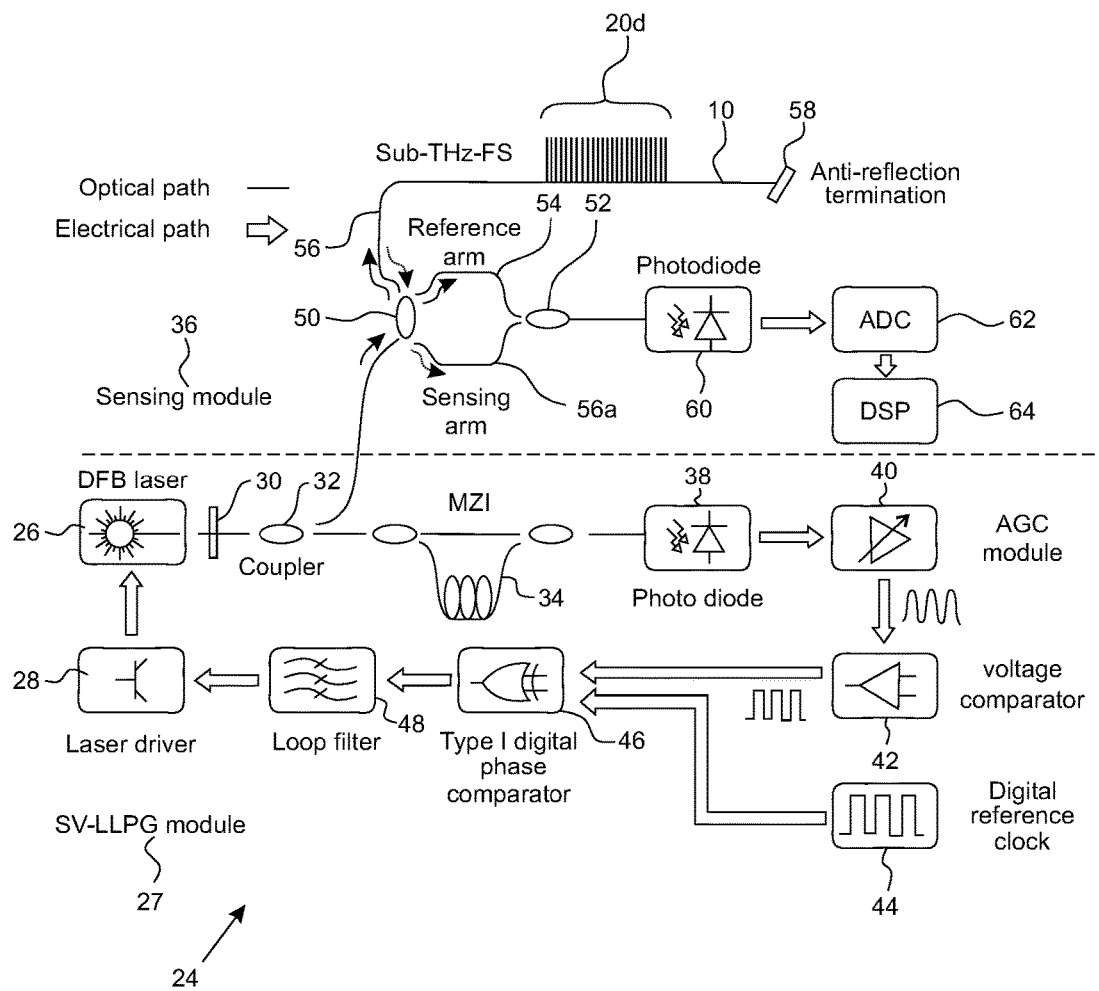
Figure 4A:
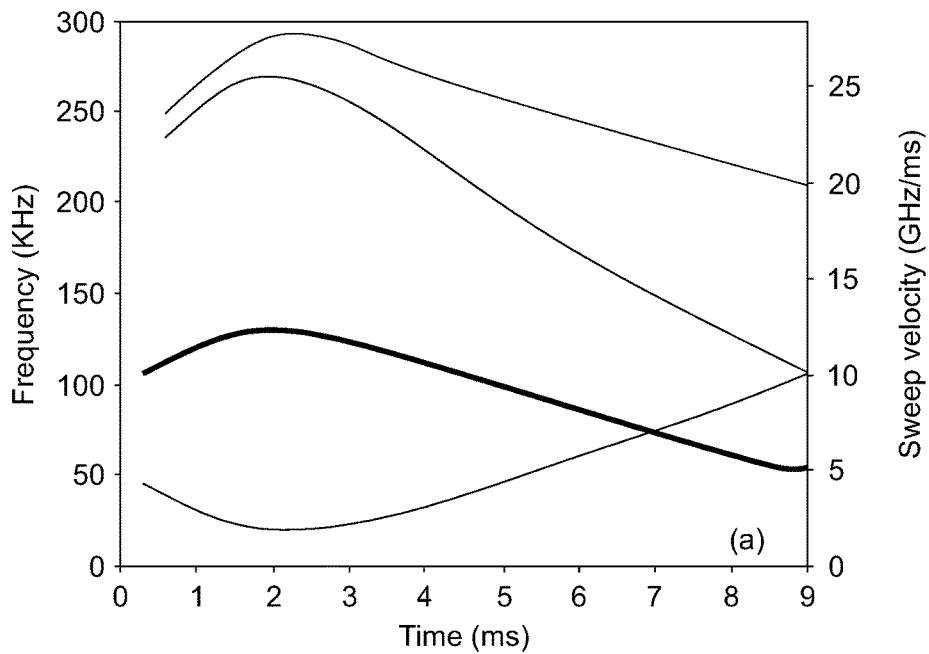
Figure 4B:
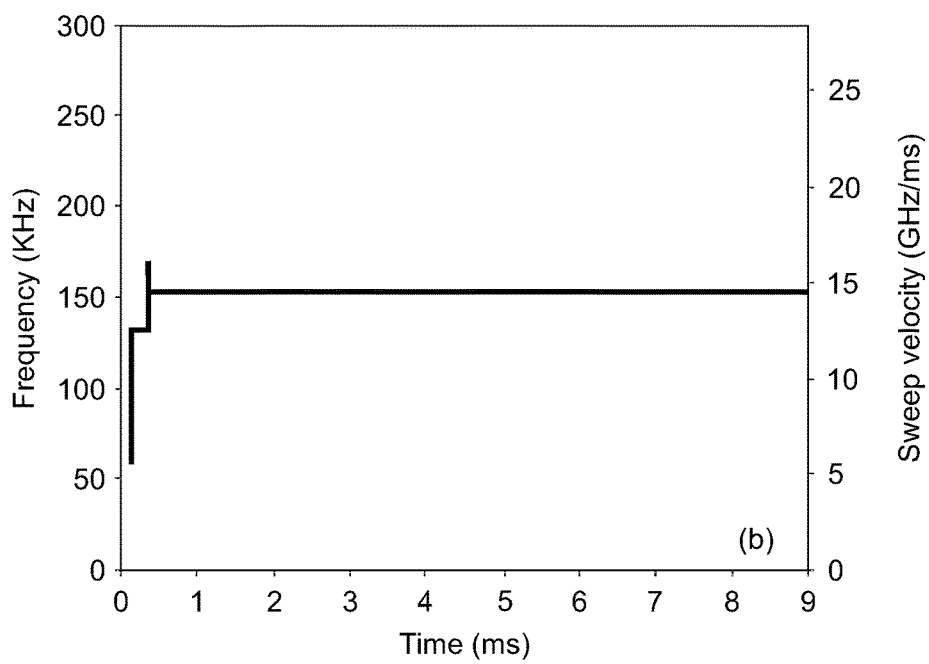
Figure 5A:
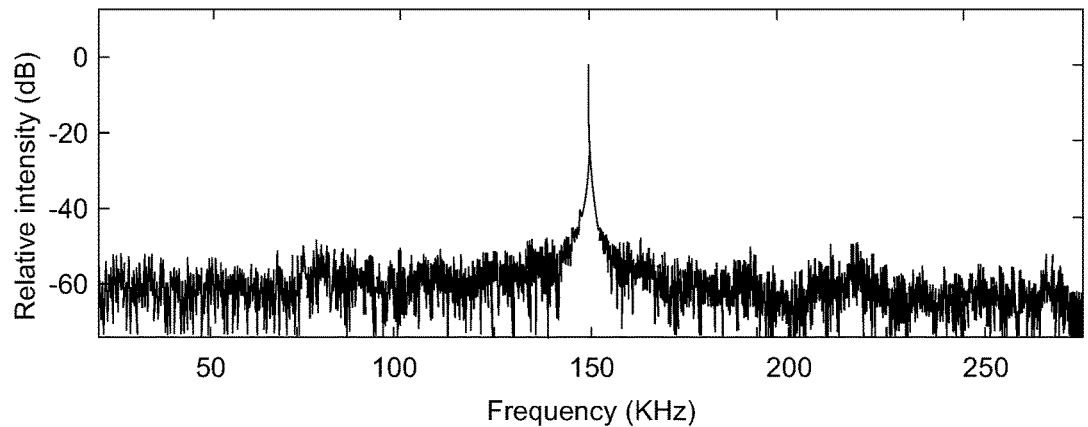
Figure 5B:
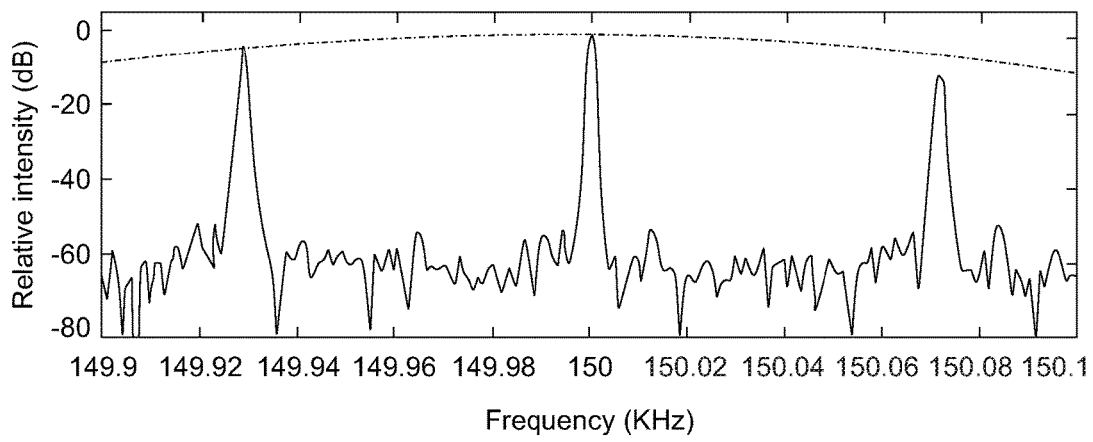
Figure 6A:
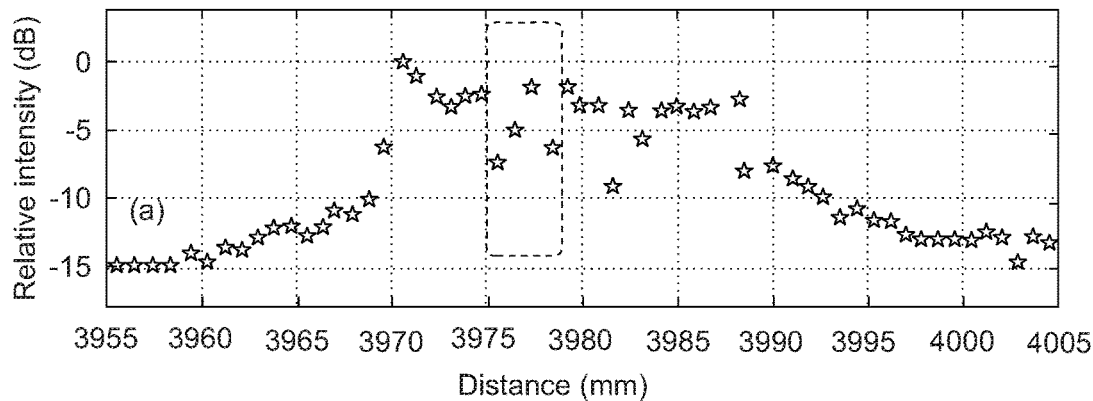
Figure 6B:
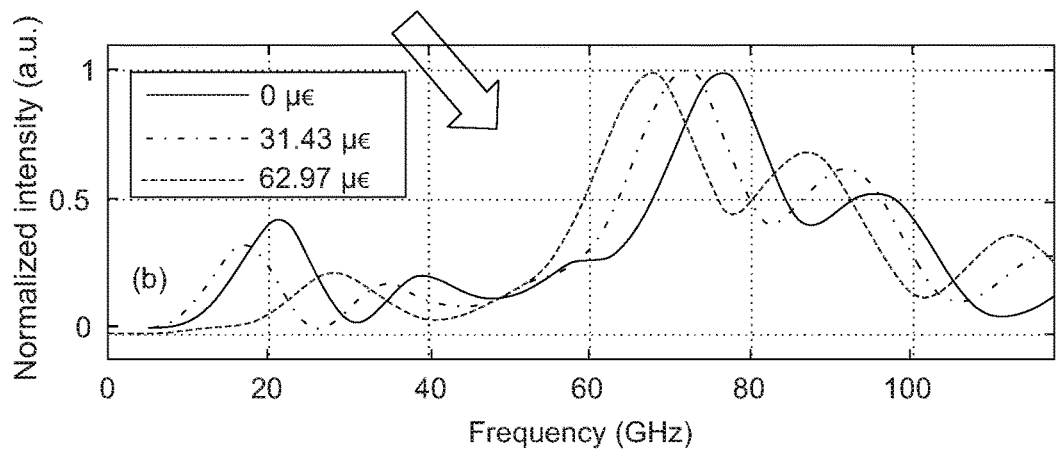
Figure 6C:
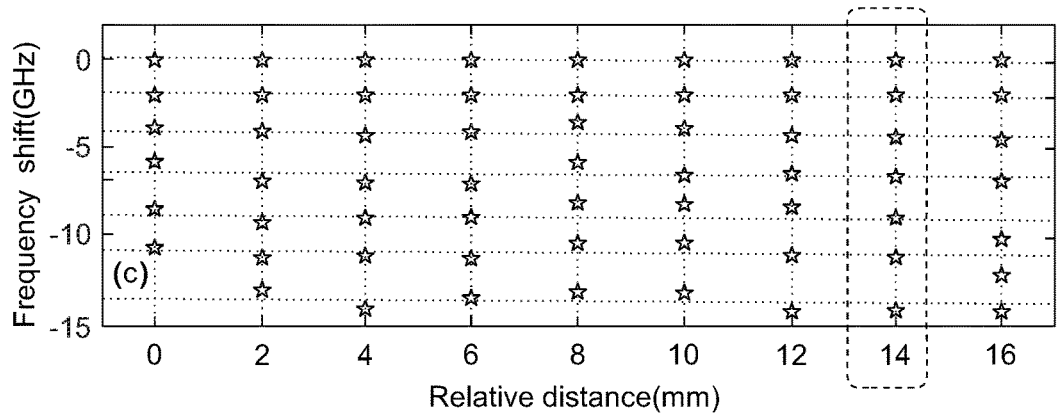
Figure 6D:
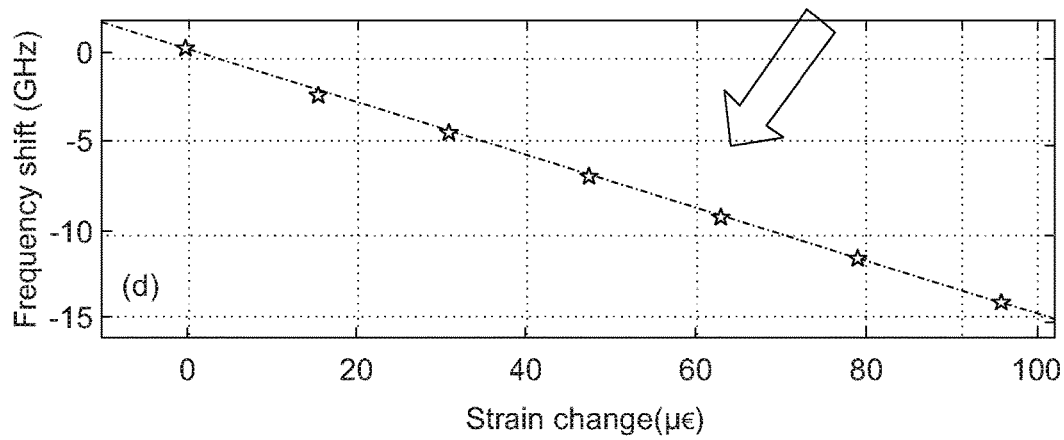
Figure 7:
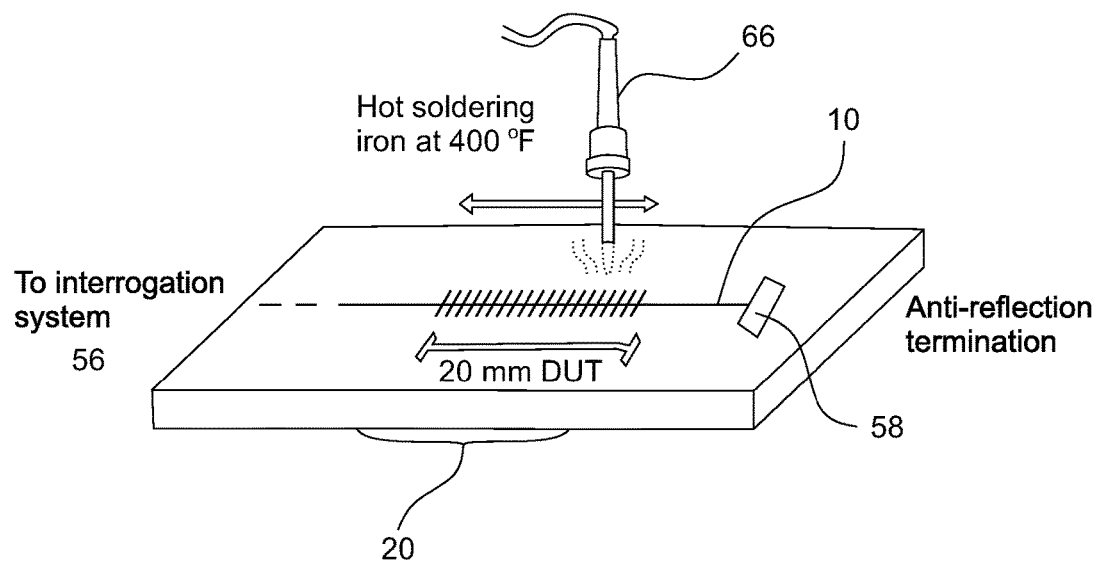

FIG. 2*b* is a side elevation view of the core and cladding of an optical fiber including a plurality of cascaded, equal-length, sub-terahertz reflector cavities;

FIG. 2*c* is a side elevation view of the core and cladding of an optical fiber including a sub-terahertz-range reflector structure (grating);

FIG. 2*d* is a side elevation view of the core and cladding of an optical fiber including cascaded, sub-terahertz-range gratings;

FIG. 2*e* is a side elevation view of the core and cladding of an optical fiber including a continuously distributed sub-terahertz-range grating over the entire length of fiber;

FIG. 3 is a schematic view of the present sub-THz-range interrogation system;

FIG. 4*a* is a spectrogram of AGC output within a free running chirped laser pulse;

FIG. 4*b* is a spectrogram of AGC output within a sweep velocity locked chirped laser pulse;

FIG. 5*a* is a Fourier transform of the AGC output over the span of 8.3 ms under locked conditions;

FIG. 5*b* shows a Gaussian curve fit applied to the measure of the Full Width at Half Maximum (FWHM) of the Fourier transform of a chirped pulse train over 1 second;

FIGS. 6*a-d* show various measurements of static strain testing wherein FIG. 6*a* shows a time domain reflection of the Device Under Test (DUT), FIG. 6*b* shows interferograms of the sensor unit between 3975 mm and 3979 mm with varied strain applied, FIG. 6*c* shows strain test results for all 9 sensor units; and FIG. 6*d* shows strain test results for the 8$^{th}$ sensor unit;

FIG. 7 is a schematic illustration of a distributed temperature test setup; and

Figure 8A:
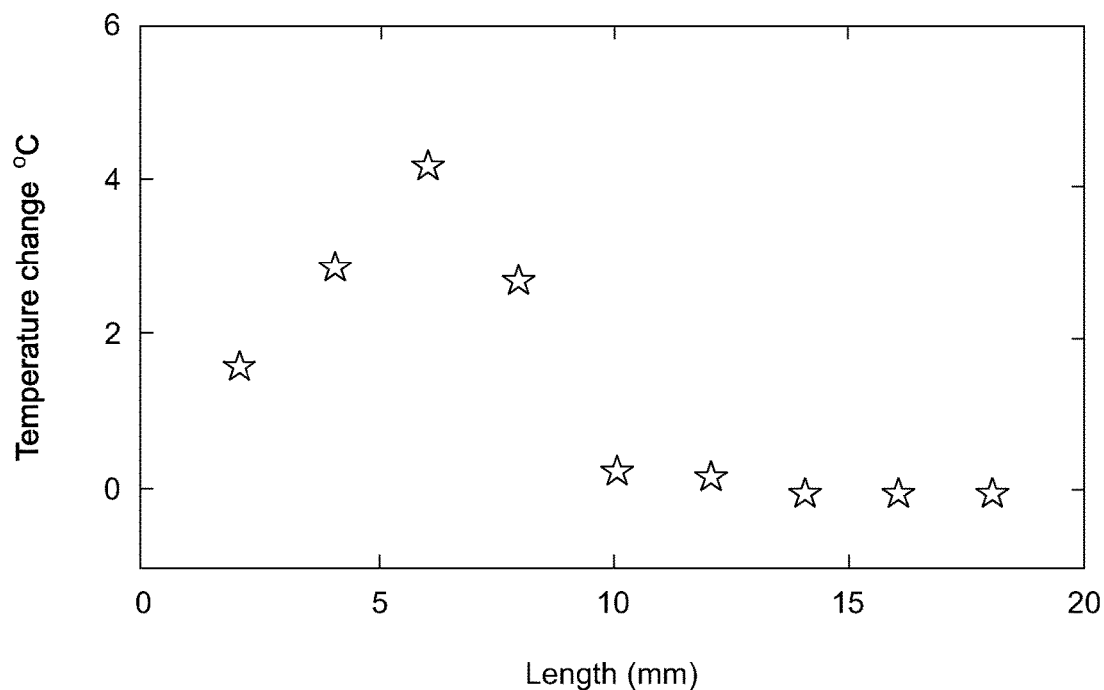
Figure 8B:
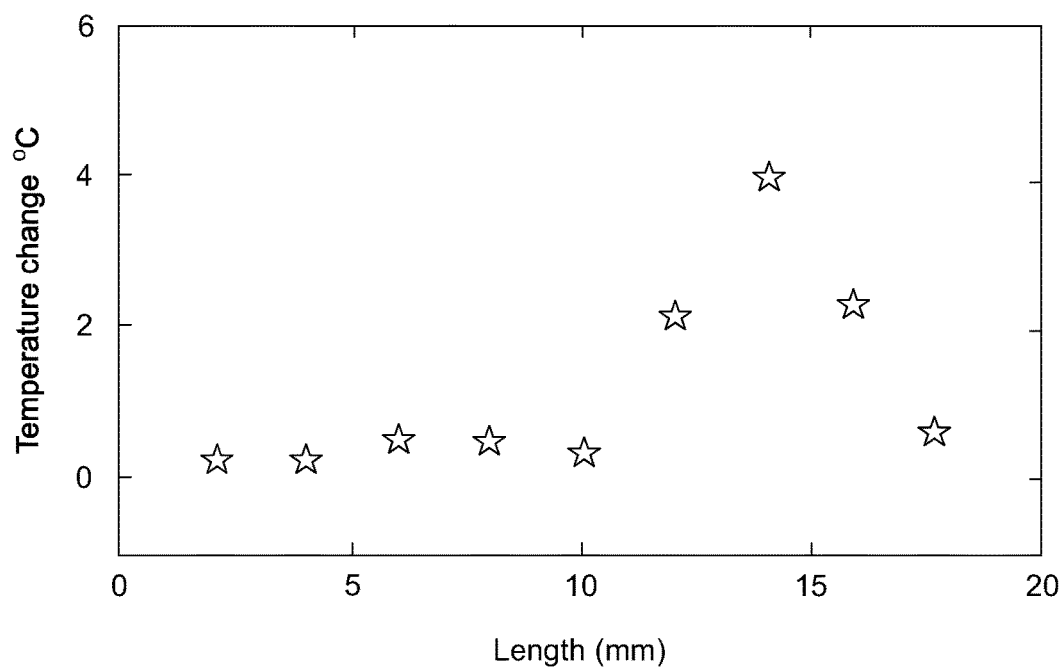

FIGS. 8*a* and 8*b* show measured temperature distributions with the heat source at different locations along the Fiber Under Test (FUT).

DETAILED DESCRIPTION OF THE INVENTION

Figure 1:
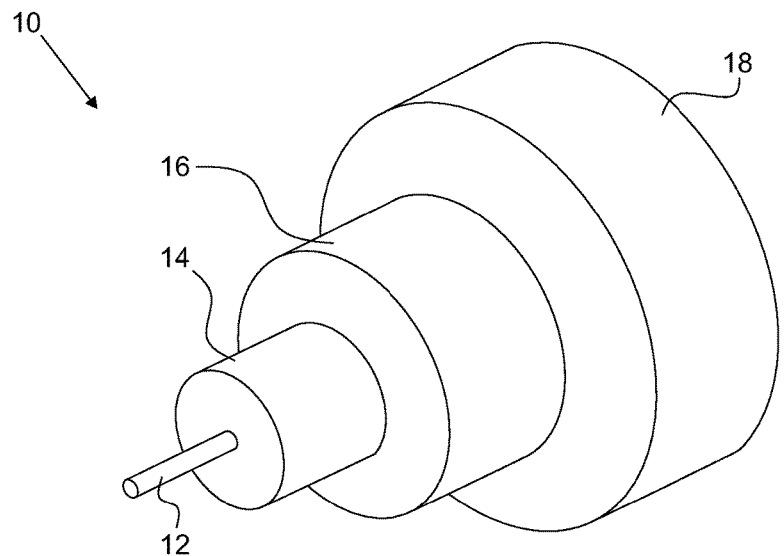
FIG. 1 is a view of an exemplary fiber optic cable construction for use as the fiber under interrogation.

Referring now to the drawings, an exemplary embodiment of an optical fiber is generally indicated at 10 in FIG. 1. The optical fiber includes an inner core 12 extending along the length of the fiber 10 and a cladding 14 surrounding the inner core 12. The optical fiber 10 may optionally include a buffer layer 16 surrounding the cladding 14, and an outer jacket 18 surrounding the buffer layer 16.

Turning to FIGS. 2A-2E, the optical fiber 10 for use in distributed sensing applications may include at least one sensing structure 20. In the exemplary embodiments, the sensing elements comprise, an ultra-weak terahertz-range reflector structure 20 formed in the fiber core 12 along a length of the fiber 10. Each of the reflector structures 20 comprises at least two ultra-weak reflectors 22 having a spacing or pitch length Δz corresponding to the terahertz range (See FIG. 2E). Each of the reflectors 22 comprises a physical discontinuity in the core 12, which changes the refractive index of the core material. FIG. 2A shows two spaced reflectors 22 forming a reflector cavity 20A (interferometric cavity). FIG. 2B shows a plurality of spaced cavities 20A (cascaded cavities). FIG. 2C shows a plurality of spaced reflectors 22 forming a grating 20B. FIG. 2D shows a plurality of spaced gratings 20B. FIG. 2E shows a continuous grating 20C formed by a plurality of reflectors 22.

The reflector structures, or sensing structures, 20 in the illustrated embodiments are equally spaced. However, the scope of the disclosure is not limited to equally spaced terahertz-range structures, and should also be considered to include phase-shifted, period-chirped, and/or apodized grating structures, as well as other intrinsic or introduced discontinuities such as Rayleigh backscatter.

Turning to FIG. 3A, an exemplary schematic of the proposed interrogation system is shown, and generally indicated at 24. A current-controlled laser 26 serves as the laser source for the Sweep Velocity-Locked Laser Pulse Generator (SV-LLPG) module 27. The laser 26 is modulated using a time-varying voltage signal through a laser driver circuit 28. An isolator 30 is placed at the output of the laser 26 to eliminate reflection. Using a 90/10 coupler (CPL) 32, 10% of the laser power is directed into a fixed Mach-Zender Interferometer (MZI) 34 to monitor sweep speed, while 90% of the remaining laser power is sent into the sensing module 36 (upper part of FIG. 3) to activate and interrogate the sub-THz-FSs 20. The MZI 34 has a fixed delay, $t_d$, of 10.58 ns. Under the assumption that the laser 26 is operated with an ideal constant sweep velocity, the AC-coupled current output of the photo diode 38 after the MZI 34 as a function of time, i(t), can be expressed as:

$$i(t) = \frac{A(t)^2}{8}\eta\cos[2\pi(f_0 + vt)\tau_d] \quad (1)$$

where A(t) is the amplitude of the electric field directed into the MZI 34 as a function of time, η is the light-to-voltage conversion coefficient of the photodiode 38, $f_0$ is the starting frequency of the laser sweep, v is the optical frequency sweep velocity, and t is time. Light passing through the MZI 34 generates a beat frequency in the radio frequency (RF) range, which is linearly proportional to the optical frequency sweep velocity given a fixed MZI delay, $t_d$.

Due to the current injection modulation, the intensity of the laser output varies as a function of time. To account for this effect, an automatic gain control (AGC) transimpedance amplifier 40 is used to adjust the amplitude of the AC-coupled signal output of the photodiode 38. A voltage comparator 42 is used to convert the analog beat signals generated by the MZI 34 into digital signals, which are then compared to a high-quality digital reference clock 44 with a frequency, $f_R$, of 150 kHz. Phase errors are then extracted via a type I digital phase comparator 46. A loop filter 48 is used to convert the digital phase error signal into a laser control signal, which is then fed into the laser driver 28 to complete the control loop. It is noted that the SV-LLPG module 27 can be considered a digital version of an optical phase locked loop (OPLL), and obviates the need for optical amplitude feedback control of analog OPLLs. Additionally, no polarization maintaining devices were included in the entire system. It is noted that certain digital component portions of the SV-LLPG module can be integrated into an "application specific integrated circuit" ASIC to simplify the system and reduce costs. These components include but are not limited to the loop filter 48, digital phase comparator 46, and reference clock 44.

A spectrogram of the AGC 40 output during a chirped laser pulse under free-running, open loop operation (when the AGC output is disconnected from the voltage comparator) is shown in FIG. 4(*a*). After closing the control loop, the output of AGC, and thus laser sweep velocity, is locked during each chirped laser pulse. When locked, the AGC 40 is in phase with the digital reference clock 44; the locked optical frequency sweep velocity, v, can therefore be expressed as:

$$v = \frac{f_R}{\tau_d} \quad (2)$$

Given the fixed MZI delay and reference frequency, the locked sweep velocity is calculated to be ~14.2 GHz/ms. FIG. 4(b) shows the AGC 40 output within a chirped pulse under the sweep velocity locked condition. The total locking period within a chirped pulse is ~8.3 ms, leading to an optical interrogation bandwidth of 117.69 GHz.

FIG. 5a shows the Fourier transform of the AGC 40 output over the span of 8.3 ms under locked condition. Over that span, a signal-to-noise ratio (SNR) above 50 dB was achieved. During testing, a resting period of 5 ms followed each 9 ms sweep in order to discharge the capacitors in the loop filter 48, resulting in a total 14 ms for each complete pulse cycle and a reputation rate of 71 Hz. To determine the noise of the system, 1 second of data with 71 chirped laser pulses was recorded. The Fourier transform of this data is plotted in FIG. 5(b). A 71 Hz frequency period was observed due to the repetition rate. The full width at half maximum (FWHM) of the peak envelope using a Gaussian curve fit was measured to be 116 Hz (See FIG. 5(b).

A homodyne configuration was constructed using two 2×2 3-dB couplers 50, 52, depicted in the sensing module 36 of FIG. 3. The input light is split into two paths via the first coupler 50, with one path serving as the reference arm 54 and the other path directed into the sensing arm 56 including a sub-THz-FS array 20d. The sensing arm 56 is terminated using an anti-reflection cut 58. The reflected light 56a from sub-THz-FSs 20d is then combined with light from the reference arm 54 through the second coupler 52. A photodetector 60 and a single channel AC-coupled 12-bit ADC 62 is used to record the resulting data. The sampling rate of the ADC 62 is set to 8 MSa/s with a matched anti-aliasing filter (not shown). The digitized raw data is then fed into a DSP module 64.

In an exemplary embodiment, a 20-pt periodic weak reflection sub-THz-FS array 20d with a 1 mm pitch length was fabricated along a single mode fiber 10 (SMF-28, Corning, Inc.) using a Ti: Sapphire femtosecond laser (Coherent, Inc.). During interrogation and signal processing, the sub-THz-FS array was considered as 9 cascaded Sub-THz-grating sensor units using a 4-mm wide moving Butterworth bandpass filter with a step size of 2-mm. This signal processing method has been systematically investigated in previous publications. The interferograms of the target sensor units were extracted using a self-mixing method and a low-pass filter. Changes in strain or temperature along the optical fiber result in optical path length (OPL) changes between the weak reflectors of the sub-THz-FS array 20d. Thus, a phase-shift in the resulting interferogram can be used to measure strain and temperature along the sensor probe.

An exemplary strain sensing embodiment is further described below in connection with FIGS. 6a-6d. One end of the device under test (DUT) was secured to an optical bench while the other end was left free to hang. Weights were sequentially added to the free end of the fiber at 1.33 g intervals. In total, 7.98 g of weights were added to the free end of the DUT, resulting in a strain change of 93.92µε. The SV-LLPG system 27 was set using the parameters described above, resulting in a total sweeping bandwidth of 117.69 GHz. The resulting distance domain signals, calculated using a Fourier transform and in which the sensor structures can be identified between 3969 mm and 3989 mm, are plotted in FIG. 6(a). The individual reflection peaks of the sub-THz-FS array elements cannot be resolved due to the narrow bandwidth used for interrogation. The measured frequency domain interferograms of the $3^{rd}$ sensor unit between 3975 mm and 3979 mm are plotted in FIG. 6(b). The strain test results for all 9 sensor units are plotted in FIG. 6(c), and the results of the $8^{th}$ sensor unit specifically are plotted in FIG. 6(d). Linear results were observed for all sensor units, with the least linear having a $R^2$ value of 0.9950. The mean strain sensitivity across all sensing elements was calculated to be −0.1436 GHz/µε with a standard deviation of 0.0078 GHz/µε. A stability test was conducted in which the sub-THz-FS array was affixed to an optical bench and no strain changes applied. 100 groups of measurements were collected; the maximum standard deviation among these sensor units was calculated to be 0.16 GHz, corresponding to a detection limit of 1.11µε. The starting sweep frequency was evaluated by measuring the starting frequency of the entire system over 1000 captures, and the standard deviation of the start frequency was 109 MHz.

An exemplary distributed sensing embodiment of the system in the form of a dynamic temperature test is explained below in connection with FIGS. 7 and 8(a)-8(b). A schematic illustration of the testing setup is shown in FIG. 7(a). The interrogator setup was identical to that of the static strain test. A heat source (a soldering iron tip heated to 400° F.) 66 was then placed approximately 2 mm from the sub-THz-FS array 20. The heat source 66 was free to move along the direction of the array 20 in order to introduce a changing temperature distribution at various locations along the optical fiber 10. A graphical unit interface (GUI) was employed to generate temperature profile along the Sub-THz-FS array 20 in real-time at a refresh rate of 2.5 Hz. FIGS. 8(a) and 8(b) show the measured temperature distributions with the heat source 66 at different locations.

It can therefore be seen that the exemplary embodiments provide a unique and novel advancement, which has substantial potential as a series of low-cost and high-performance distributed sensor systems.

While there is shown and described herein certain specific structures embodying various embodiments of the invention, it will be manifest to those skilled in the art that various modifications and rearrangements of the parts may be made without departing from the spirit and scope of the underlying inventive concept, and that the same is not limited to the particular forms herein shown and described except insofar as indicated by the scope of the appended claims.

What is claimed is:

1. A pulsed laser source for use in an interrogation system for an optical fiber including at least one sensing structure, the pulsed laser source comprising:
   a laser;
   a laser driver circuit operating the laser at a constant sweep velocity;
   a coupler splitting output of the laser into a sensing portion and a control portion;
   a Mach-Zender Interferometer (MZI) receiving said control portion of the coupler output, said MZI having a fixed delay and outputting an analog beat signal;
   a PhotoDiode (PD) receiving output from the MZI and generating an AC-coupled signal output;

an Automatic Gain Control (AGC) amplifier operative to adjust an amplitude of the AC-coupled signal output of the PD;

a voltage comparator receiving output from said AGC and converting said output into digital signals;

a Digital Reference Clock;

a Digital Phase Comparator receiving said digital signals from said AGC and from said Digital Reference Clock, and generating a digital phase error signal; and a loop filter receiving said digital phase error signal and generating a time varying laser control signal provided to said laser driver circuit, wherein the laser is modulated by the time varying signal through the laser driver to produce a sweep velocity-locked laser pulse.

2. The pulsed laser source of claim 1 wherein the tuning bandwidth is about 117 GHz.

3. The pulsed laser source of claim 1 wherein the sweep velocity is about 14 GHz/ms.

4. The pulsed laser source of claim 1 further comprising an isolator at an output of said laser.

5. The pulsed laser source of claim 1 wherein said coupler is a 90/10 coupler providing 10% of the laser output for the control loop portion.

6. An interrogation system for distributed measurements of an optical fiber comprising:

a sensing module including an optical fiber having at least one sensing structure; and a sweep velocity-locked laser pulse generator (SV-LLPG) controlled with a digital phase-locked loop (DPLL) circuit having an output coupled said sensing module, said (SV-LLPG) interrogating said optical fiber, said sensing module further including a sensing path for detecting changes in reflections and interference patterns caused by physical changes in said optical fiber.

7. The interrogation system of claim 6 wherein said sensing structure comprises a continuous grating written along an entire length of said optical fiber.

8. The interrogation system of claim 6 wherein said sensing structure comprises at least one sub-terahertz-range fiber structure.

9. The interrogation system of claim 6 wherein said sensing structure comprises an intrinsic or modified Rayleigh backscatter profile.

10. The interrogation system of claim 6 wherein said sensing module comprises a circulator receiving an output from said laser pulse generator and having an interrogation path including said optical fiber, and further having parallel reference and sensing paths which are recombined in a downstream coupler.

11. The interrogation system of claim 10 wherein said sensing module further comprises a PhotoDiode (PD) receiving output from said downstream coupler, an analog to digital converter (ADC) receiving analog output from said PD and a Digital Signal Processor (DSP) receiving digital output from said ADC.

12. The interrogation system of claim 6 wherein said interrogator system comprises a laser;

a laser driver circuit operating the laser at a constant sweep velocity;

a coupler splitting output of the laser into a sensing portion and a control portion;

a Mach-Zender Interferometer (MZI) receiving said control portion of the coupler output, said MZI having a fixed delay and outputting an analog beat signal;

a PhotoDiode (PD) receiving output from the MZI and generating an AC-coupled signal output;

an Automatic Gain Control (AGC) amplifier operative to adjust an amplitude of the AC-coupled signal output of the PD;

a voltage comparator receiving output from said AGC and converting said output into digital signals;

a Digital Reference Clock;

a Digital Phase Comparator receiving said digital signals from said AGC and from said Digital Reference Clock, and generating a digital phase error signal; and a loop filter receiving said digital phase error signal and generating a time varying laser control signal provided to said laser driver circuit, wherein the laser is modulated by the time varying signal through the laser driver to produce a sweep velocity-locked laser pulse.

13. The interrogation system device of claim 10 wherein said sensing module comprises a circulator receiving an output from said laser pulse generator and having an interrogation path including said optical fiber, and further having parallel reference and sensing paths which are recombined in a downstream coupler.

14. The interrogation system device of claim 13 wherein said sensing module further comprises a PhotoDiode (PD) receiving output from said downstream coupler, an analog to digital coverter (ADC) receiving analog output from said PD and a Digital Signal Processor (DSP) receiving digital output from said ADC.

* * * * *